(12) United States Patent
Yang et al.

(10) Patent No.: US 6,254,676 B1
(45) Date of Patent: Jul. 3, 2001

(54) METHOD FOR MANUFACTURING METAL OXIDE SEMICONDUCTOR TRANSISTOR HAVING RAISED SOURCE/DRAIN

(75) Inventors: Gwo-Shii Yang, Hsinchu; Michael W C Huang, Taipei Hsien; Chien Chao Huang, Kaohsiung; Hsien-Ta Chung, Taichung; Tri-Rung Yew, Hsinchu Hsien, all of (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/340,969

(22) Filed: Jun. 28, 1999

(51) Int. Cl.$^7$ .................................................. C30B 25/14
(52) U.S. Cl. .................. 117/95; 117/94; 117/96; 438/286; 438/284; 438/282; 438/283; 438/987
(58) Field of Search ................... 117/95, 96, 94; 438/286, 981, 279, 282, 283, 284

(56) References Cited

U.S. PATENT DOCUMENTS

| | | | |
|---|---|---|---|
| 4,682,404 | * | 7/1987 | Miller et al. . |
| 5,185,280 | * | 2/1993 | Houston et al. ........................ 437/44 |
| 5,340,762 | * | 8/1994 | Vora ...................................... 438/194 |
| 5,432,366 | * | 7/1995 | Banerjee et al. ...................... 257/327 |
| 5,567,629 | * | 10/1996 | Kubo ........................................ 437/24 |
| 5,741,737 | * | 4/1998 | Kachelmeier ........................ 438/236 |
| 6,020,227 | * | 2/2000 | Bulucea ................................ 438/194 |
| 6,027,975 | * | 2/2000 | Hergenrother et al. ............. 438/268 |
| 6,077,744 | * | 2/2000 | Hao et al. ............................. 438/268 |

* cited by examiner

Primary Examiner—Robert Kunemund
(74) Attorney, Agent, or Firm—Thomas, Kayden, Horstemeyer & Risley, LLP

(57) ABSTRACT

A method for manufacturing a metal oxide semiconductor transistor having a raised source/drain is described. A first spacer is formed on a sidewall of a gate electrode. An epitaxial layer is then formed on the exposed surface of the substrate and a top surface of the gate electrode. A light implantation step is then performed on the substrate while using the gate electrode and the first spacer as a first mask. Thereafter, a second spacer is formed on the sidewall of the gate electrode. A heavy implantation step is then performed on the substrate while using the gate electrode, the first spacer and the second spacer as a second mask. The epitaxial layer is then formed before the forming of the extension structure of the source/drain. Therefore, dopants in a source/drain extension structure avoid suffering the high temperature needed to form the epitaxial layer so that the redistribution of the dopants is prevented.

20 Claims, 2 Drawing Sheets

METHOD FOR MANUFACTURING METAL OXIDE SEMICONDUCTOR TRANSISTOR HAVING RAISED SOURCE/DRAIN

BACKGROUND OF THE INVENTION

1. Field of Invention

The present invention relates to method for manufacturing a metal oxide semiconductor transistor. More particularly, the present invention relates to a method for manufacturing a metal oxide semiconductor transistor having a raised source/drain.

2. Description of Related Art

Progress in semiconductor fabrication technologies has made it possible to fabricate semiconductor devices at the ULST level. However, even though decreasing the size of devices increases the density and operation efficiency of the integrated circuit, such a decrease is still accompanied by a short channel effect, which decreases the device performance. As the size of devices decrease, the major parameters which may affect the electric property of the transistor include: the length of the channel, saturation of speed, resistance of the source/drain region, penetration of electrons, drain induced barrier lowing (DIBL), geometric shape and etc.

When the channel length is shorter than the junction depth of the source/drain, major charges on the channel located below the gate electrode transfer into the junction depletion region of the source/drain and only minor charges transfer into the gate electrode; hence, the threshold voltage is decreased. Conventionally, in order to minimize the variation of the threshold voltage, an extension structure of the source/drain region is formed on the substrate corresponding to the source/drain region of the transistor and an epitaxial layer functioning as a raised source/drain is formed on the source/drain. The high temperature, above about 800 degrees centigrade, at which the epitaxial layer is formed redistributes the dopants previously doped into the extension structure of the source/drain. Therefore, it is hard to control the outline of the shallow junction. Furthermore, the large variation of the threshold voltage and the decreasing of the device reliability are unavoidable.

SUMMARY OF THE INVENTION

The invention provides a method for manufacturing a metal oxide semiconductor transistor having a raised source/drain, the method comprising the steps of providing a substrate having a source/drain region. A gate oxide layer is then formed on the substrate. Thereafter, a patterned gate electrode is formed on the gate oxide layer. A first spacer is then formed on a sidewall of the gate electrode. The gate oxide layer on the source/drain region, which is located on the opposite sides of the gate electrode, is removed to expose a surface of the substrate. An epitaxial layer is formed on the exposed surface of the substrate and a top surface of the gate electrode. An implantation step is performed on the substrate to form a source/drain extension structure in the substrate while using the gate electrode and the first spacer as a first mask. A second spacer is formed on the sidewall of the gate electrode. A heavy implantation step is then performed on the substrate to form a heavily doped source/drain while using the gate electrode, the first spacer and the second spacer as a second mask so that the metal oxide semiconductor transistor having a raised source/drain is obtained.

The invention provides a method for manufacturing a metal oxide semiconductor transistor having a raised source/drain, suitable for use on a substrate having a gate electrode, the method comprising the steps of forming a first spacer on a sidewall of the gate electrode and forming an epitaxial layer on the exposed surface of the substrate and a top surface of the gate electrode. A light implantation step is performed on the substrate to form a source/drain extension structure in the substrate while using the gate electrode and the first spacer as a first mask. A second spacer is formed on the sidewall of the gate electrode and a heavy implantation step is then performed on the substrate to form a heavily doped source/drain while using the gate electrode, the first spacer and the second spacer as a second mask, wherein the characteristic of the invention is that the epitaxial layer is formed before the source/drain extension structure and the heavily doped source/drain.

The invention provides a method for manufacturing a metal oxide semiconductor transistor having a raised source/drain, suitable for use on a substrate having a gate electrode, and a gate oxide layer is formed between the gate electrode and the substrate, the method comprising the steps of forming a first spacer on a sidewall of the gate electrode and forming an epitaxial layer on the exposed surface of the substrate and a top surface of the gate electrode. A light implantation step is performed on the substrate while using the gate electrode and the first spacer as a first mask. A second spacer is performed on the sidewall of the gate electrode and a heavy implantation step is performed on the substrate while using the gate electrode, the first spacer and the second spacer as a second mask.

As described in the preferred embodiment of the present invention, the epitaxial layer is formed before the extension structure of the source/drain, Therefore, dopants in the extension structure of the source/drain are prevented from suffering from the high temperature needed to form the epitaxial layer so that the redistribution of the dopants is avoided and the junction outline is controlled more easily than in the prior art.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
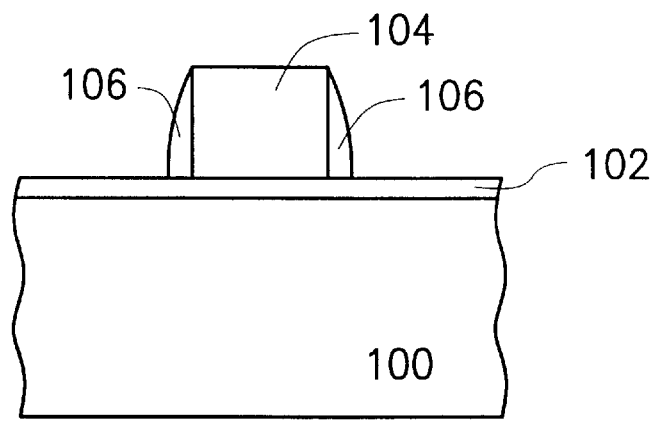
FIGS. 1A to 1F are schematic, cross-sectional views showing the steps of forming the metal oxide semiconductor transistor having a raised source/drain.

Referring to FIG. 1A, a substrate 100 having semiconductor devices, for example, a device isolation structure (not shown), formed thereon is provided. A gate oxide layer 102 is then formed on the substrate 100. Thereafter, a patterned gate electrode 104 is formed on the gate oxide layer 102.

A first spacer 106 is formed on the sidewall of the gate electrode 104 by chemical vapor deposition (CVD). The first spacer 106 is composed of an insulation material, for example, oxide or nitride having a low dielectric constant, to prevent the epitaxial silicon layer and the gate electrode 104 from raising the parasitic capacitance problem.

Figure 1B:
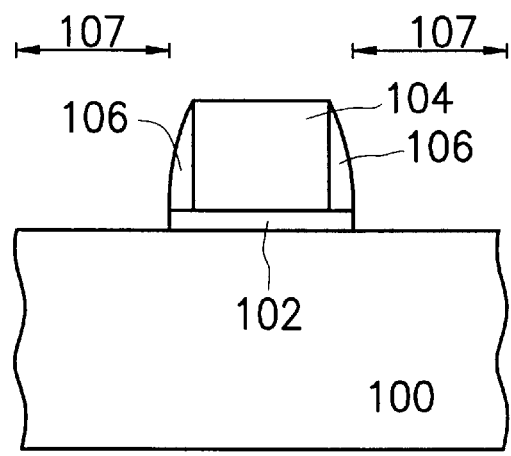

Referring to FIG. 1B, the gate oxide layer 102 on the source/drain region 107 which is located on the opposite side of the gate electrode 104 is removed by photolithography and etching processes so that the surface of the substrate 100 includes the exposed surface of the source/drain region 107.

Figure 1C:
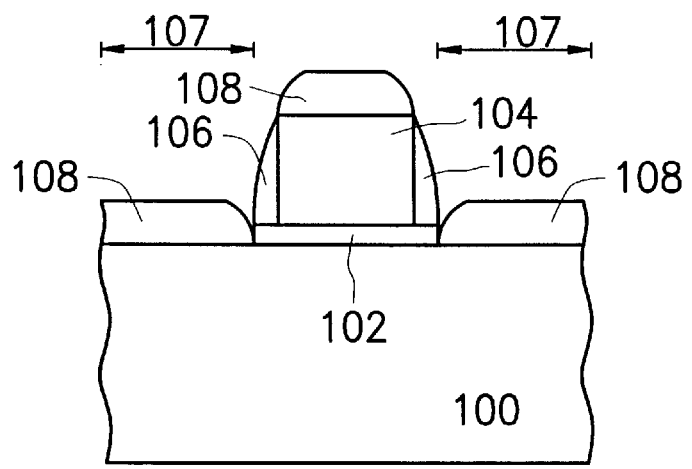

Referring to FIG. 1C, an epitaxial formation step is carried out to form a layer of epitaxy 108 having a thickness of between about 200 Å and about 800 Å on the exposed surface of the substrate and the top surface of the gate 104. The epitaxial layer 108 is formed by utilizing the epitaxial formation of silicon or both silicon and germanium.

Figure 1D:
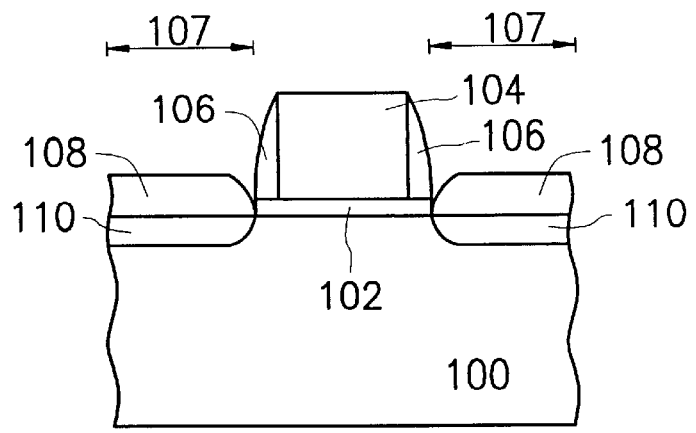

Referring to FIG. 1D, an implantation step is performed to implant ions into the substrate while using the gate electrode 104 and the first spacer 106 as a mask so that an extension structure 110 of the source/drain is formed within the source/drain region 107.

Figure 1E:
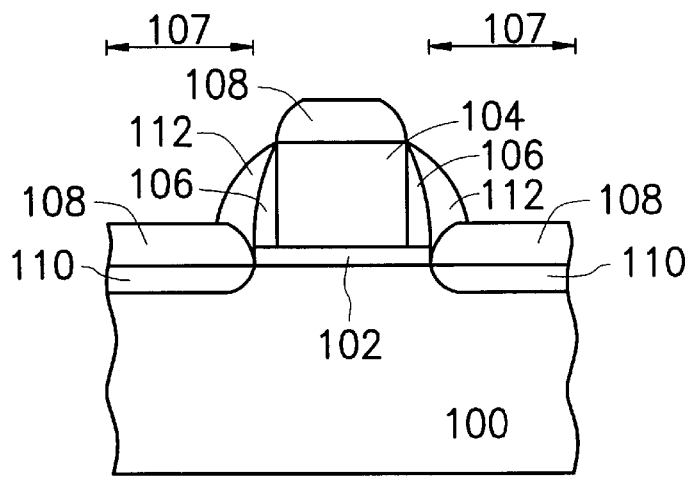

Referring to FIG. 1E, a second spacer 112 is formed, by chemical vapor deposition, on the sidewall of the gate electrode 104 and abuts the first spacer 106. The second spacer 112 is composed of an insulation material such as oxide or nitride.

Figure 1F:
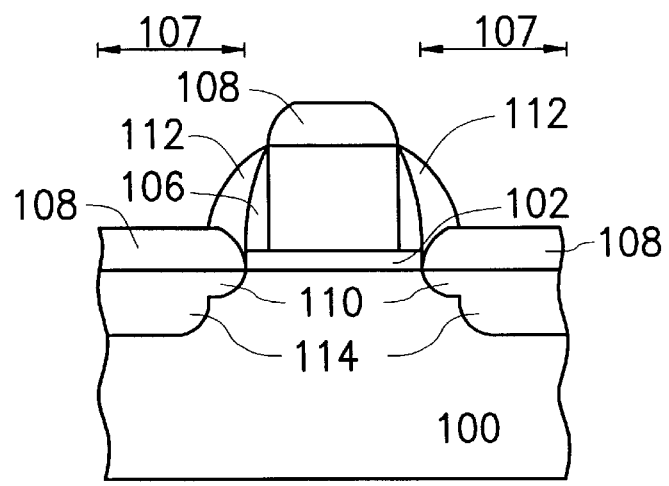

Referring to FIG. 1F, an implantation having a high dosage is performed on the source/drain region 107 of the substrate 100 to form a heavily doped source/drain 114 on the source/drain region 107 of the substrate 100.

According to the steps described above, the metal oxide semiconductor having a raised source/drain is obtained.

As described in the preferred embodiment of the present invention, the epitaxial layer is formed before the extension structure of the source/drain. Therefore, dopants in the extension structure of the source/drain are prevented from suffering the high temperature needed to form the epitaxial layer so that the redistribution of the dopants is avoided.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for manufacturing a metal oxide semiconductor transistor having a raised source/drain, the method comprising:

providing a substrate having a source/drain region;

forming a gate oxide layer on the substrate;

forming a patterned gate electrode on the gate oxide layer;

forming a first spacer on a sidewall of the gate electrode;

removing the gate oxide layer on the source/drain region, which is located at each side of the gate electrode, to expose a surface of the substrate;

forming an epitaxial layer on the exposed surface of the substrate and a top surface of the gate electrode;

lightly implanting the substrate to form a source/drain extension structure in the substrate while using the gate electrode and the first spacer as a first mask;

forming a second spacer upon the first spacer on the sidewall of the gate electrode; and heavily implanting the substrate to form a heavily doped source/drain while using the gate electrode, the first spacer and the second spacer as a second mask;

wherein the step of forming the epitaxial layer is performed before the steps of lightly implanting the substrate to form a source/drain extension structure and heavily implanting the substrate to form a heavily doped source/drain.

2. The method according to claim 1, wherein the epitaxial layer is formed before the source/drain extension structure and the heavily doped source/drain.

3. The method according to claim 1, wherein the first spacer is made of oxide or nitride.

4. The method according to claim 1, wherein the first spacer has a thickness of less than about 500 Å.

5. The method according to claim 1, wherein the removal of the gate oxide layer is performed by using photolithography and etching.

6. The method according to claim 1, wherein the epitaxial layer silicon.

7. The method according to claim 1, wherein the epitaxial layer is made of germanium.

8. The method according to claim 1, wherein the epitaxial layer has a thickness of between about 200 Å and about 800 Å.

9. A method for manufacturing a metal oxide semiconductor transistor having a raised source/drain, the method comprising:

providing a substrate having a gate electrode and a source/drain region therein;

forming a first spacer on a sidewall of the gate electrode;

forming an epitaxial layer on the exposed surface of the substrate and a top surface of the gate electrode;

lightly implanting the substrate to form a source/drain extension structure in the substrate while using the gate electrode and the first spacer as a first mask;

forming a second spacer upon the first spacer on the sidewall of the gate electrode; and heavily implanting the substrate to form a heavily doped source/drain while using the gate electrode, the first spacer and the second spacer as a second mask;

wherein the step of forming the epitaxial layer is performed before the step of lightly implanting the substrate to form the source/drain extension structure and the step of heavily implanting the substrate to form the heavily doped source/drain.

10. The method according to claim 9, wherein the first spacer is made of oxide or nitride.

11. The method according to claim 9, wherein the first spacer has a thickness of less than about 500 Å.

12. The method according to claim 9, wherein the epitaxial layer is made of silicon.

13. The method according to claim 9, wherein the epitaxial layer is made of germanium.

14. The method according to claim 9, wherein the epitaxial layer has a thickness of between about 200 Å and about 800 Å.

15. A method for manufacturing a metal oxide semiconductor transistor having a raised source/drain region, the method comprising sequentially:

providing a substrate having a gate electrode and a source/drain region;

forming a first spacer on a sidewall of the gate electrode;

forming an epitaxial layer on the exposed surface of the substrate and a top surface of the gate electrode;

lightly implanting the substrate while using the gate electrode and the first spacer as a first mask;

forming a second spacer upon the first spacer on the sidewall of the gate electrode; and heavily implanting the substrate while using the gate electrode, the first spacer and the second spacer as a second mask.

16. The method according to claim 15, wherein the first spacer is made of oxide or nitride.

17. The method according to claim 15, wherein the first spacer has thickness of less than about 500 Å.

18. The method according to claim 15, wherein the epitaxial layer is made of silicon.

19. The method according to claim 15, wherein the epitaxial layer is made of germanium.

20. The method according to claim 15, wherein the epitaxial layer has a thickness of between about 200 Å and about 800 Å.

* * * * *